(12) United States Patent
Kato (10) Patent No.: US 7,545,618 B2
(45) Date of Patent: Jun. 9, 2009

(54) SEMICONDUCTOR DEVICE

(75) Inventor: Katsuhiro Kato, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 334 days.

(21) Appl. No.: 11/279,570

(22) Filed: Apr. 13, 2006

(65) Prior Publication Data

US 2006/0250734 A1    Nov. 9, 2006

(30) Foreign Application Priority Data

May 9, 2005    (JP)    ............................... 2005-135652

(51) Int. Cl.
*H02H 3/22*    (2006.01)
(52) U.S. Cl.    ..................... 361/111; 361/56; 361/91.1
(58) Field of Classification Search ............... 361/56, 361/91.1, 111; 257/355–360; 327/112, 437; 326/85, 87
See application file for complete search history.

(56) References Cited

U.S. PATENT DOCUMENTS

| 4,851,721 | A | * | 7/1989 | Okitaka | ...................... 327/433 |
| 5,089,728 | A | * | 2/1992 | Nguyen | ....................... 327/384 |
| 5,237,395 | A | * | 8/1993 | Lee | .............................. 257/358 |
| 5,510,728 | A | * | 4/1996 | Huang | .......................... 326/30 |
| 5,550,486 | A | * | 8/1996 | Sweeney et al. | ............... 326/14 |
| 5,825,601 | A | * | 10/1998 | Statz et al. | ..................... 361/56 |
| 6,690,561 | B2 | * | 2/2004 | Hung et al. | .................. 361/111 |
| 6,912,109 | B1 | * | 6/2005 | Ker et al. | ....................... 361/56 |

FOREIGN PATENT DOCUMENTS

JP    2002/324842 A    11/2002

\* cited by examiner

*Primary Examiner*—Stephen W Jackson
*Assistant Examiner*—Terrence R Willoughby
(74) *Attorney, Agent, or Firm*—Volentine & Whitt, P.L.L.C.

(57) ABSTRACT

A semiconductor device includes one or more first transistors of which each source connects to a power wiring, a second transistor of which a source connects to a ground wiring and a drain connects to a drain of the first transistor, one or more third transistors of which each source connects to the power wiring and each drain connects to the drains of the first and second transistors, and a gate potential control circuit which controls the gate potential of the third transistors based on the potential of the power wiring.

13 Claims, 10 Drawing Sheets

SEMICONDUCTOR DEVICE

BACKGROUND OF THE INVENTION

1. Field of the Invention

The present invention relates to a semiconductor device which in particular is used for improving the withstand voltage characteristics of a CMOS (Complimentary Metal Oxide Semiconductor) transistor circuit.

2. Background Information

Conventionally, CMOS transistor circuits are widely used in conventional semiconductor devices with integrated circuits (hereinafter to be referred to simply as semiconductor devices). A CMOS transistor circuit has a MOS transistor which forms a p-type channel in an operation (hereinafter referred to as a pMOS transistor), and a MOS transistor which forms an n-type channel in an operation (hereinafter referred to as an nMOS transistor). In this structure, a common control voltage is impressed to the gates of the pMOS transistor and nMOS transistor. The source of the pMOS transistor is connected to a power wiring $L_{VDD}$ to which an internal power supply voltage VDD will be impressed, and the source of the nMOS transistor is connected to a grounding wiring. Therefore, by connecting the drains of the pMOS transistor and the nMOS transistor with a common wiring, when a High level potential (e.g. the same level as the potential of the internal power supply voltage) is impressed to the gates of these transistors, for instance, the nMOS transistor is turned on while the pMOS transistor is turned off. Thereby, a Low level potential is outputted to the common wiring from the CMOS transistor circuit. On the other hand, when a Low level potential (e.g. the same level as the ground potential) is impressed to the gates of these transistors, for instance, the pMOS transistor is turned on while the nMOS transistor is turned off. Thereby, a High level potential is outputted to the common wiring from the CMOS transistor.

A commonly used semiconductor device comprising such CMOS transistor circuit mentioned above has a structure in which a gate is formed over a comparatively shallow doped layer while sandwiching a comparatively thin gate oxide in between, and thereby, high integration can be achieved. Therefore, in a commonly used semiconductor device having the structure mentioned above, one problem is that the device will easily break down due to a surge current when a static charge or the like is inputted externally. When using the CMOS transistor mentioned above, for instance, a surge current flows from the source of the pMOS transistor to the drain of the pMOS transistor when a static charge is inputted between the power wiring $L_{VDD}$ and the grounding wiring $L_{GND}$. This surge current flows to the nMOS transistor from the pMOS transistor via the common wiring to which the drains of the pMOS transistor and the nMOS transistor are connected, and is discharged to the grounding wiring $L_{GND}$ via the nMOS transistor. At this time, if a withstand voltage of the nMOS transistor is insufficient, the nMOS transistor, particularly the drain thereof, may break down due to the surge current.

In order to protect a CMOS transistor from such surge current, in the conventional art, a protective circuit is connected in parallel to the CMOS transistor.

In this case, the protective circuit applies the surge current to itself by turning on before the surge current can flow into the CMOS transistor. For instance, a widely used HBM (Human Body Model) test suggests that a surge current with 1.33 A (ampere) can flow into the protective circuit when a static charge with 2 kV (kilo volt), which is a guaranteed value of a withstand voltage, is inputted to the CMOS transistor. By applying such comparatively large current to itself, the protective circuit can protect the CMOS transistor from the surge current.

As mentioned above, conventionally, when ensuring an ESD (electrostatic discharge) protection characteristic of a semiconductor device, a load current is concentrated at the protective circuit, or partially distributed to the protective circuit, in order to cover the weakness of a circuit that is an object of protection (i.e., a CMOS transistor in this case).

In addition, one problem is that, if a withstand voltage characteristic of the protective circuit is insufficient, the protective circuit itself may break down due to a surge current. Technology for coping with such problem is introduced in Japanese Laid-Open Patent Application No. 2002-324842 (hereinafter to be referred to as Patent Reference 1) for instance. In the technology according to Patent Reference 1, a bias voltage is impressed to a semiconductor on which a protective circuit having an nMOS transistor and a CMOS transistor circuit is formed. By this arrangement, a withstand voltage of the protective circuit can be improved.

Usually, in order to obtain higher highly integration, a CMOS transistor circuit comprises more than several hundred transistors even if small in size. At this time, it is desirable that pMOS transistors and nMOS transistors (hereinafter to be simply referred to as transistors when it is not necessary to distinguish between a pMOS transistor and an nMOS transistor) are designed to be as small as possible while ensuring a minimum required current driving ability for performance. By this arrangement, it becomes possible to miniaturize a chip size and reduce manufacturing costs while reducing a circuit forming area.

In the meantime, in order for the protective circuit to not be damaged by the surge current it bears by itself, the protective circuit has to be designed by applying particular design measurements in which measurements of portions relating to ESD protection characteristics become larger than the measurements of the transistors that construct the CMOS transistor circuit, while there are a number of design measurements which define the shapes of the transistors.

One of the design measurements that affects the ESD protection characteristic is the distance between the gate and the contact formed on the drain (hereinafter to be referred to as a gate-to-drain distance). For instance, if the gate-to-drain distance of the transistor constructing the CMOS transistor circuit is set to 0.4 μm (micrometer), a gate-to-drain distance of the transistor, particularly the nMOS transistor, constructing the protective circuit should normally be set to several times as large as a gate-to-drain distance of the transistor constructing the CMOS transistor circuit (e.g. 2.0 μm, which is five times as large). In this way, by designing the protective circuit such that the gate-to-drain distance of the transistor constructing the protective circuit is set large, it is possible to ease the damage that the transistor of the protective circuit might receive at the time when the static charge is inputted, and as a result, the withstand voltage characteristics of the protective circuit can be improved.

However, even when the protective circuit is connected in parallel to the CMOS transistor circuit as described above, the transistors constructing the CMOS transistor circuit are still left in a weaken state against a surge current that can be produced by the static charge etc. In this case, it is possible to have most of the surge current imposed on the protective circuit for the purpose of reducing the amount of current flowing to the CMOS transistor circuit. However, even with such arrangement, the problem of the surge current, the amount of which the protective circuit is unable to bear, flowing into the CMOS transistor circuit still remains.

In order to construct a CMOS transistor circuit such that it will not be damaged by a surge current flowing thereto, it is necessary to design it to be large in size, and to disperse the surge current evenly throughout the entire CMOS transistor circuit.

In order to disperse the surge current evenly throughout the entire CMOS transistor circuit, a ratio between a gate width of the pMOS transistor constructing the CMOS transistor circuit and a gate width of the nMOS transistor also constructing the CMOS transistor circuit has to be constant, and this applies to all the transistors constructing the CMOS transistor circuit.

Figure 1:
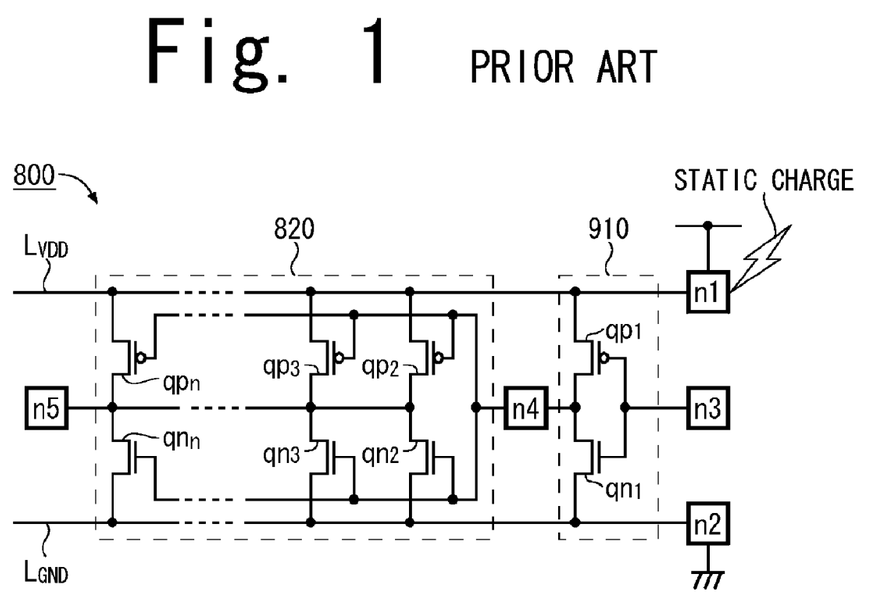
FIG. 1 is a circuit diagram showing the structure of a semiconductor device as comparative example 1.

FIG. 1 shows a circuit structure of a semiconductor device 800 including a buffer circuit 820 and an inverter circuit 910 as comparative example 1. The buffer circuit 820 is designed such that the ratio between the gate width of a pMOS transistor and the gate width of an nMOS transistor is constant. In FIG. 1, individual pMOS transistors $qp_2$-$qp_n$ have the same gate width. Likewise, individual nMOS transistors $qn_2$-$qn_n$ have the same gate width.

As shown in FIG. 1, when the pMOS transistors $qp_2$-$qp_n$ and the nMOS transistors $qn_2$-$qn_n$ having a constant gate width ratio between themselves are arranged in one-to-one correspondence, respectively, a surge current will be dispersed evenly on all of pMOS transistors $qp_2$-$qp_n$ and the nMOS transistors $qn_2$-$qn_n$ which are all connected in between a power wiring $L_{VVD}$ and a grounding wiring $L_{GND}$. Therefore, with this structure, it is possible to improve the withstand voltage characteristics of the buffer circuit 820 which is a CMOS transistor circuit.

When the semiconductor device is constructed in this way, even if a comparatively small CMOS transistor circuit (e.g., a CMOS transistor circuit including a few to several dozen pMOS transistors and nMOS transistors (corresponding to the inverter circuit 910 in FIG. 1)) is formed together with a comparatively large CMOS transistor circuit (e.g., a CMOS transistor circuit including over a few hundred of pMOS transistors and nMOS transistors (corresponding to the buffer circuit 820 in FIG. 1)) between the same power wiring $L_{VVD}$ and grounding wiring $L_{GND}$, a surge current will be distributed according to the size of the circuit, and therefore, the current density of each element will become constant. As a result, the semiconductor device 800 as a whole can obtain certain voltage withstand characteristics.

However, when a CMOS transistor circuit having transistors in which the gate width ratio is different from that of the transistors of other CMOS transistor circuits is connected together with the other CMOS transistor circuits between the same power wiring $L_{VVD}$ and grounding wiring $L_{GND}$, there is a possibility that only the CMOS transistor circuit having the different gate width ratio will become easily damaged. This is because the surge current might be concentrated at the CMOS transistor circuit having the different gate width ratio.

Prior to explaining the reason why only the CMOS transistor circuit having the different gate width ratio will become easily damaged in the above-mentioned case where a CMOS transistor circuit having a different gate width ratio is connected together with other CMOS transistor circuits having the same gate width ratio between the same power wiring $L_{VVD}$ and grounding wiring $L_{GND}$, an explanation will be given as to how the gate width ratio between a pMOS transistor and an nMOS transistor is normally determined in the design process.

Generally, a gate width ratio between a pMOS transistor and an nMOS transistor constructing a CMOS transistor circuit is set to 2:1. This is because there is a difference in mobility between an electron hole being a charge carrier in the pMOS transistor and an electron being a charge carrier in the nMOS transistor. That is, the mobility of the electron hole which is the charge carrier in the pMOS transistor is about half the mobility of the electron which is the charge carrier in the nMOS transistor. When an output potential of the CMOS transistor circuit is brought up to a level of internal power supply voltage VDD (e.g. 1.8V) from a ground level GND, the pMOS transistor functions as an active element, whereas the nMOS transistor functions as an active element when an output potential of the CMOS transistor circuit is brought down to the ground level GND (0V) from the level of internal power supply voltage VDD (e.g. 1.8V). Here, considering the nature of circuit operations, it is preferable that the time periods necessary for rising and decaying (here, 'decaying' is defined as a transition of level from H level to L level), respectively, are the same. While taking these factors into consideration, the gate width ratio between the pMOS transistor and the nMOS transistor is designed to be 2:1 in order to have approximately the same operation speed (i.e., the time period necessary for status transition) between the pMOS transistor and the nMOS transistor.

However, there are cases in which a gate width ratio of the pMOS transistor and the nMOS transistor constructing a CMOS transistor circuit is designed to be not necessarily constant. This is because, for instance, with respect to a CMOS transistor circuit in which a common control voltage is applied to a pMOS transistor and an nMOS transistor, a through current will flow into the CMOS transistor circuit when the transistors have the same operation speed. For example, when the common control voltage applied to a gate of each transistor is switched from a level of internal power supply voltage VDD to a ground level GND, the pMOS transistor will turn from ON to OFF while the nMOS transistor will turn from OFF to ON. At this time, there is a certain period of time in which the pMOS transistor and the nMOS transistor are both in ON, and the through current will flow from a power wiring $L_{VVD}$ to a grounding wiring $L_{GND}$ via the CMOS transistor circuit during this certain period of time.

Since such through current will increase power consumption in a semiconductor device including the CMOS transistor circuit, it is desirable that such through current is not generated, especially in electronic devices such as a cellular phone, where power saving is given priority. Particularly, when the gate width of both the pMOS transistor and the nMOS transistor constructing the CMOS transistor circuit is large, even if the period of time during which both the transistors would simultaneously be ON is very short, a considerable amount of through current would flow between the power wiring $L_{VVD}$ and the grounding wiring $L_{GND}$. In such case, therefore, it is desirable that the through current is reduced as much as possible.

With respect to a method of reducing the through current, a method of decreasing the gate width of one of the pMOS transistor and the nMOS transistor constructing the CMOS transistor circuit is available, for example, either of which having less influence on circuit performance.

Figure 2:
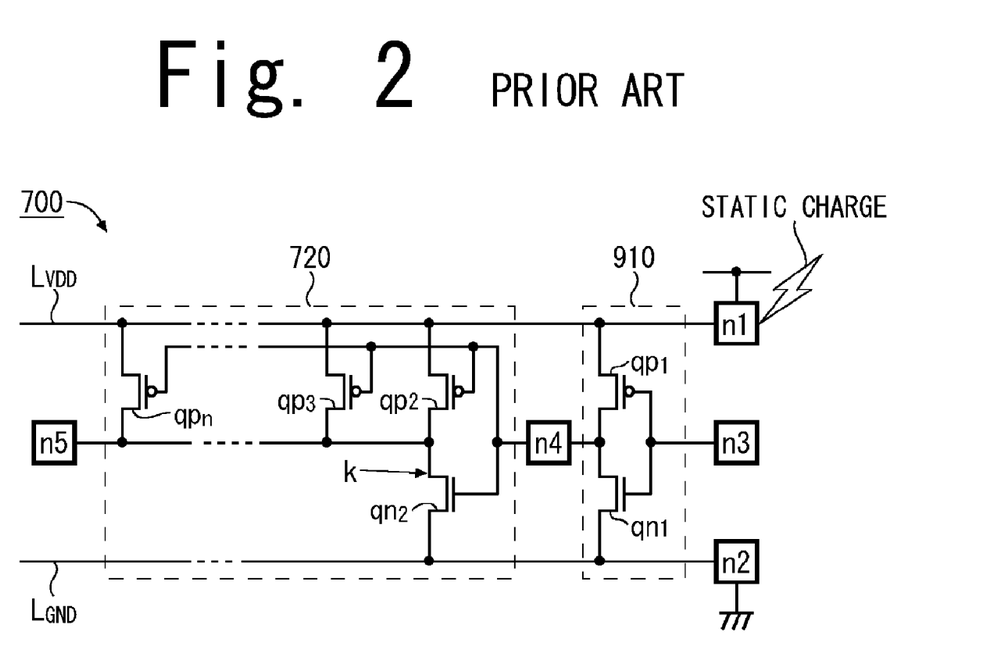
FIG. 2 is a circuit diagram showing the structure of a semiconductor device as comparative example 2.

FIG. 2 shows a circuit structure of a semiconductor device 700 including a buffer circuit 720 and the inverter circuit 910, as comparative example 2. The buffer circuit 720 has an nMOS transistor having a decreased gate width. As shown in FIG. 2, the semiconductor device 700 has a modified structure of the semiconductor device 800 shown in FIG. 1 where the nMOS transistors $qn_2$-$qn_n$ of the buffer circuit 820 are replaced with a single nMOS transistor $qn_2$. This means that the semiconductor device 700 has a structure in which the total gate width of the nMOS transistors is decreased by eliminating the nMOS transistors $qn_3$-$qn_n$.

In this way, by decreasing the gate width of either transistor, the operation speed of this transistor will slow down, and thereby, it is possible to prevent through current from being generated due to the pMOS transistor and the nMOS transistor turning on simultaneously.

However, when reducing the gate width of the nMOS transistor as shown in FIG. 2, a surge current having passed through pMOS transistors $qp_2$-$qp_n$ in the buffer circuit 720 will all flow into the nMOS transistor $qn_2$, and this leads to a problem in which the nMOS transistor $qn_2$, particularly the drain thereof (indicated as point k in FIG. 2) becomes damaged due to the surge current.

As can be seen from a semiconductor device 600 illustrated in FIG. 3 as comparative example 3, one method of resolving the problem mentioned above would be a method in which a dummy circuit 621 made up of a number of nMOS transistors (hereinafter to be referred to as dummy nMOS transistors) $qn_3$-$qn_n$, each of which gate is connected to a grounding wiring $L_{GND}$ via a resistance R1, i.e., each of which gate potential is fixed to a GND level, is connected in parallel to an nMOS transistor $qn_2$, in place of the eliminated transistors (e.g., nMOS transistors $qn_3$-$qn_n$ in the comparative example 2 shown in FIG. 2), for instance.

Figure 3:
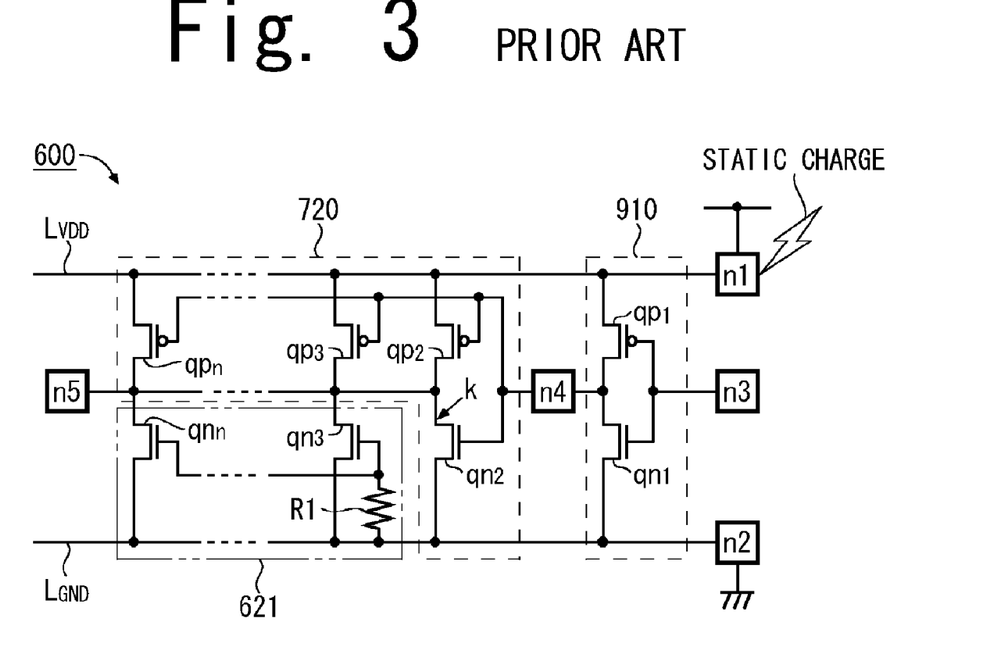
FIG. 3 is a circuit diagram showing the structure of a semiconductor device as comparative example 3.

In the semiconductor device 600 shown in FIG. 3, a surge current flowing into the pMOS transistors $qp_2$-$qp_n$ of the buffer circuit 720 as a whole will be dispersed on the dummy nMOS transistors $qn_3$-$qn_n$ as well as the nMOS transistor $qn_2$. As a result, the buffer circuit 720 will be able to have an improved withstand voltage characteristic.

However, in the above structure, the gate potential will not necessarily be the same between the nMOS transistor $qn_2$ and the dummy nMOS transistors $qn_3$-$qn_n$ in the buffer circuit 720. Therefore, there might be cases in which the surge current will not be dispersed evenly throughout the nMOS transistor $qn_2$ and the dummy nMOS transistors $qn_3$-$qn_n$. As a result, particularly the nMOS transistor in the buffer circuit 720 may become damaged.

In view of the above, it will be apparent to those skilled in the art from this disclosure that there exists a need for an improved semiconductor device. This invention addresses this need in the art as well as other needs, which will become apparent to those skilled in the art from this disclosure.

SUMMARY OF THE INVENTION

It is therefore an object of the present invention to resolve the above-described problems, and to provide a semiconductor device which has an improved withstand voltage characteristics and which is capable of preventing the size of a circuit from becoming unnecessary large.

In accordance with a first aspect of the present invention, a semiconductor device comprises one or more first transistors of which each source connects to a power wiring, a second transistor of which a source connects to a ground wiring and of which a drain connects to a drain of the first transistor, one or more third transistors of which each source connects to the power wiring and of which each drain connects to the drains of the first and second transistors, and a gate potential control circuit which controls a gate potential of the third transistors based on a potential of the power wiring.

In accordance with a second aspect of the present invention, a semiconductor device comprises one or more first transistors of which each source connects to a power wiring, a second transistor of which a source connects to a ground wiring and of which a drain connects to a drain of the first transistor, one or more third transistors of which each source connects to the power wiring and of which each drain connects to the drains of the first and second transistors, and a gate potential control circuit which controls a gate potential of the third transistors based on a potential of the power wiring.

In accordance with a third aspect of the present invention, a semiconductor device comprises a semiconductor substrate, first to fourth doped regions formed in the surface of the semiconductor substrate, the first to fourth doped regions not in contact with one another, a first gate formed over the first and third doped regions, and a second gate formed over the second and fourth doped regions.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

First, a first embodiment of the present invention will be described in detail with reference to the drawings. This embodiment will show a semiconductor device in which a number of CMOS transistor circuits with different sizes are provided between the same power wiring $L_{VDD}$ and grounding wiring $L_{GND}$, the semiconductor device being structured such that an nMOS transistor, a drain of the nMOS transistor in particular, in the CMOS transistor circuit, will not be damaged by a surge current such as a static charge when inputted to the power wiring $L_{VDD}$.

Circuit Structure

Figure 4:
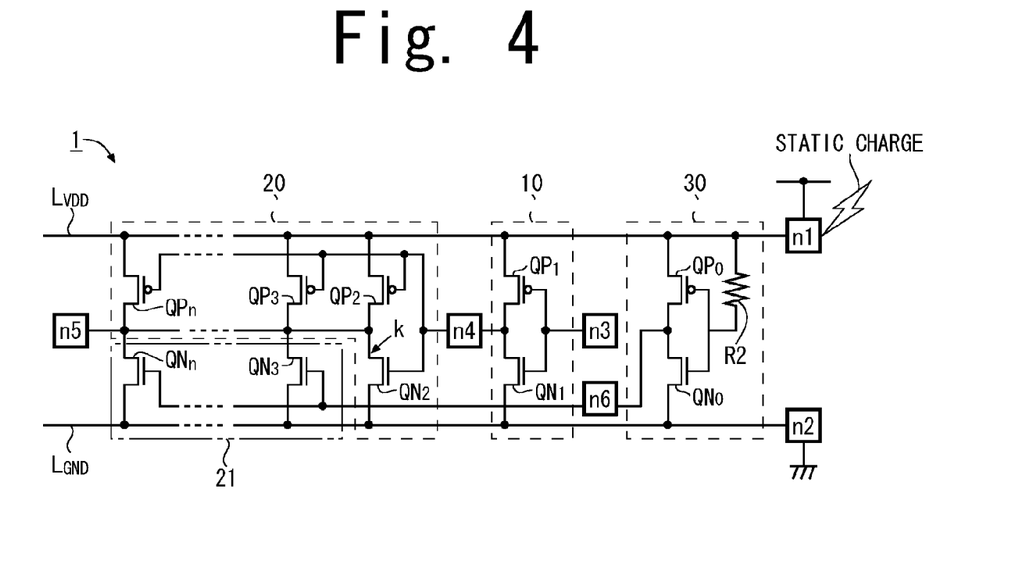
FIG. 4 is a circuit diagram showing a semiconductor device according to a first embodiment of the present invention.

FIG. 4 is a circuit diagram of a semiconductor device 1 according to the first embodiment of the present invention. As shown in FIG. 4, the semiconductor device 1 has an inverter circuit 10, a buffer circuit 20, a gate potential control circuit 30 and a dummy circuit 21. The inverter circuit 10, the buffer circuit 20 and the gate potential control circuit 30 are connected between the same power wiring $L_{VDD}$ and the grounding wiring $L_{GND}$ in parallel. The dummy circuit 21 is connected in parallel with an nMOS transistor (a second transistor) $QN_2$ of the buffer circuit 20. In this embodiment, the ratio between the gate width of a pMOS transistor and the gate width of an nMOS transistor (which may be a dummy nMOS transistor which will be described later on) is a ratio that enables the operating speed of the pMOS transistor to be equal to the operating speed of the nMOS transistor (which may be a dummy nMOS transistor), and such ratio may be approximately 2:1. This condition will be applied to all transistors in this embodiment.

Inverter Circuit 10

The inverter circuit 10 has a pMOS transistor $QP_1$ and an nMOS transistor $QN_1$. Accordingly, the inverter circuit 10 is a smaller CMOS transistor circuit than the buffer circuit 20, which will be described later on, because it has a fewer number of transistors.

In the inverter circuit 10, the source of the pMOS transistor $QP_1$ is connected to the power wiring $L_{VDD}$, and the source of the nMOS transistor $QN_1$ is connected to the grounding wiring $L_{GND}$. Furthermore, the drain of the pMOS transistor $QP_1$ and the drain of the nMOS transistor $QN_1$ are coupled together. That is, the pMOS transistor $QP_1$ and the nMOS transistor $QN_1$ are connected between the power wiring $L_{VDD}$ and the grounding wiring $L_{GND}$ in series.

Gates of the pMOS transistor $QP_1$ and the nMOS transistor $QN_1$ are connected to a node n3. A control voltage is impressed to the node n3 by an internal circuit (not shown) or an external circuit (not shown). Thereby, the pMOS transistor $QP_1$ and the nMOS transistor $QN_1$ are controlled to be switched ON or OFF by the same control voltage. The drains of the pMOS transistor $QP_1$ and the nMOS transistor $QN_1$ are both connected to a node n4 via a common wiring. Accordingly, when a control voltage of High level is impressed to the node n3, the inverter circuit 10 constructed with the pMOS transistor $QP_1$ and the nMOS transistor $QN_1$ outputs a potential of Low level to the node n4. On the other hand, when a control voltage of Low level is impressed to the node n3, the inverter circuit 10 outputs a potential of High level to the node n4. In other words, the inverter circuit 10 outputs to the node n4 a reversed potential of the control voltage impressed to the node n3.

Buffer Circuit

The buffer circuit 20 is connected with a subsequent stage of the node n4. The buffer circuit 20 has one or more pMOS transistors (first transistors) $QP_2$-$QP_n$ and an nMOS transistor $QN_2$. Accordingly, the buffer circuit 20 is a larger CMOS transistor circuit than the above-mentioned inverter circuit 10, because it has more transistors. In this embodiment, the number of the pMOS transistors $QP_2$-$QP_n$ is set to n−1 (n is more than 3) and a number of the nMOS transistor $QN_2$ is set to one, for instance. In other words, in this embodiment, as many as n−2 nMOS transistors corresponding to the pMOS transistors $QP_3$-$QP_n$ are eliminated in the first place. However, the present invention is not limited to this factor, while the nMOS transistor in the buffer circuit 20 can be provided in any number as long as the total gate width of all the nMOS transistors is less than half the total gate width of all the pMOS transistors.

In the buffer circuit 20, the sources of the pMOS transistors $QP_2$-$QP_n$ are connected with the power wiring $L_{VDD}$, and the source of the nMOS transistor $QN_2$ is connected with the grounding wiring $L_{GND}$. Furthermore, the drains of the pMOS transistors $QP_2$-$QP_n$ are connected with the drain of the nMOS transistor $QN_2$ via a common wiring.

Gates of the pMOS transistors $QP_2$-$QP_n$ and the gate of the nMOS transistor $QN_2$ are connected with the output terminal of the inverter circuit 10 via the node n4. Thereby, the pMOS transistors $QP_2$-$QP_n$ and the nMOS transitor $QN_2$ are controlled to be switched ON or OFF by the output potential of the inverter circuit 10. In addition, as described above, the output potential of the inverter circuit 10 is a reversed potential of the control voltage impressed to the node n3.

Drains of the pMOS transistors $QP_2$-$QP_n$ and the nMOS transistor $QN_2$ are connected with a node n5 via a common wiring. Accordingly, when a control voltage of High level is impressed to the node n4, the buffer circuit 20 constructed with the pMOS transistors $QP_2$-$QP_n$ and the nMOS transistor $Qn_2$ outputs a potential of Low level to the node n5. On the other hand, when a control voltage of Low level is impressed to the node n5, the buffer circuit 20 outputs a potential of High level to the node n5. In other words, the buffer circuit 20 outputs to the node n5 a reversed potential of the control voltage impressed to the node n4.

A subsequent stage of the node n5 is connected with control terminals (e.g., gates and so forth) of another CMOS transistor (not shown), for instance.

Dummy Circuit

The dummy circuit 21 has a number of (i.e., as many as n−2) dummy nMOS transistors (third transistors) $QN_3$-$QN_n$ in place of the eliminated transistors in the buffer circuit 20. That is, the dummy circuit 21 functions as a circuit for virtually supplementing the structure of the eliminated nMOS transistors in the buffer circuit 20, when a comparatively large current such as a static charge, for instance, is inputted to the power wiring $L_{VDD}$. Accordingly, in the first embodiment of the present invention, an equal number of pMOS transistors and nMOS transistors are provided in the buffer circuit 20 and the dummy circuit 21 as a whole. In the following description, in order to distinguish between the nMOS transistor $QN_2$ in the buffer circuit 20 and the nMOS transistors $QN_3$-$QN_n$ in the dummy circuit 21, the nMOS transistors $QN_3$-$QN_n$ will be referred to as dummy nMOS transistors $QN_3$-$QN_n$.

The dummy nMOS transistors $QN_3$-$QN_n$ are connected in parallel with the nMOS transistor $QN_2$ in the buffer circuit 20. That is, the drains of the dummy nMOS transistors $QN_3$-$QN_n$ are all connected to the node n5 via a common wiring to which the drains of the pMOS transistors $QP_2$-$QP_n$ and the nMOS transistor $QN_2$ in the buffer circuit 20 are connected, and the sources of the dummy nMOS transistors $QN_3$-$QN_n$ are all connected to the grounding wiring $L_{GND}$. In addition, the gates of the dummy nMOS transistors $QN_3$-$QN_n$ are connected to an output terminal of the gate potential control circuit 30, which will be described in more detail later on, via a node n6. This means that the dummy circuit 21 which is made up of dummy nMOS transistors $QN_3$-$QN_n$ has its input terminal connected to the output terminal of the gate potential control circuit 30, and it is controlled to be switched ON or OFF based on the output potential of the gate potential control circuit 30.

Gate Potential Control Circuit

The gate potential control circuit 30 whose output terminal is connected to the input terminal of the dummy circuit 21 has a pMOS transistor (a fourth transistor) $QP_0$ and an nMOS transistor (a fifth transistor) $QN_0$. In other words, the gate potential control circuit 30 is constructed with a single CMOS transistor circuit. In addition, the gate potential control circuit 30 has a resistance (a second resistance) R2 which is provided between gates of the pMOS transistor $QP_0$ and the nMOS transistor $QN_0$ and the power wiring $L_{VDD}$.

In the above structure, the source of the pMOS transistor $QP_0$ is connected to the power wiring $L_{VDD}$, and the source of the nMOS transistor $QN_0$ is connected to the grounding wiring $L_{GND}$. In addition, the pMOS transistor $QP_0$ and the nMOS transistor $QN_0$ have their drains connected with each other. This means that the pMOS transistor $QP_0$ and the nMOS transistor $QN_0$ are connected between the power wiring $L_{VDD}$ and the grounding wiring $L_{GND}$ in series.

As mentioned above, the gates of the pMOS transistor $QP_0$ and the nMOS transistor $QN_0$ are both connected to the power wiring $L_{VDD}$ via the resistance R2. Therefore, in a normal operation, an internal power supply voltage VDD (i.e. High level) is impressed to the gates of the pMOS transistor $QP_0$ and the nMOS transistor $QN_0$. Accordingly, in a normal operation, to the node n6 where the drains of the pMOS transistor $QP_0$ and the nMOS transistor $QN_0$ are both connected, an output potential of Low level is outputted from the gate potential control circuit 30.

However, at the time when a surge current such as a static charge is inputted to the power wiring $L_{VDD}$, the output of the gate potential control circuit, i.e., the drains of the pMOS transistor $QP_0$ and the nMOS transistor $QN_0$, will be in an indefinite state. Therefore, the gate potential control circuit 30 will output a potential in a level between High level and Low level (hereinafter to be referred to as a midpoint potential). Thereby, this midpoint potential will be impressed to the gate of each of the dummy nMOS transistors $QN_3$-$QN_n$ constructing the dummy circuit 21, via the node n6, and the dummy nMOS transistors $QN_3$-$QN_n$ will be turned ON either completely or incompletely. Accordingly, the surge current flowed into the drain side through the pMOS transistors $QP_2$-$QP_n$ in the buffer circuit 20 can be discharged to the grounding wiring $L_{GND}$ side through the dummy circuit 21.

Layout

Figure 5:
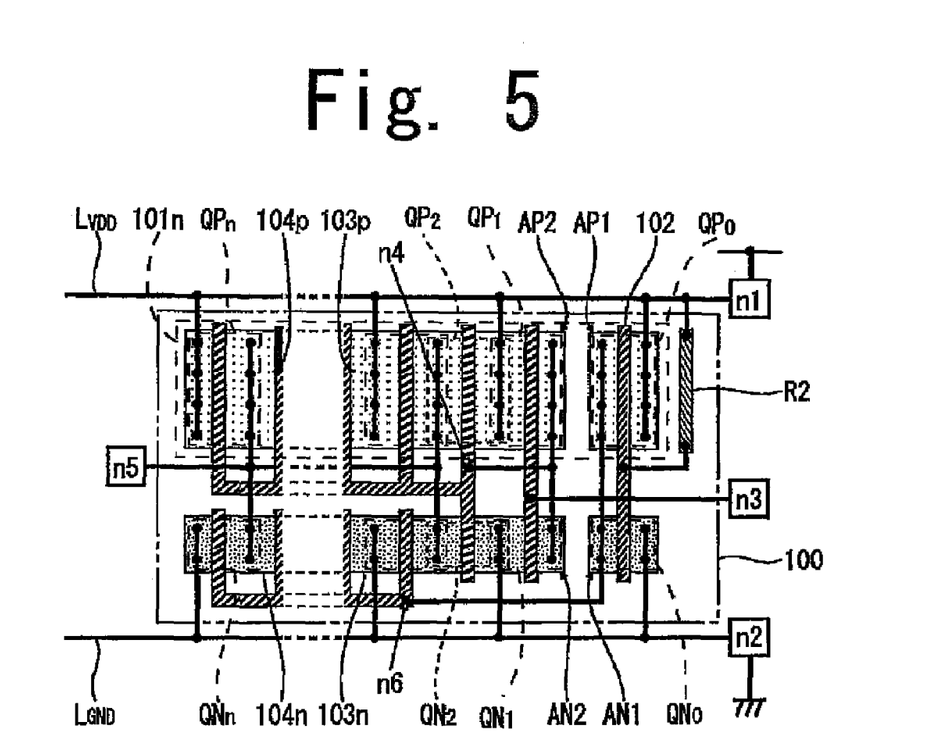
FIG. 5 is a diagram showing the layout of the semiconductor device according to the first embodiment of the present invention.

Now, the layout of the semiconductor device 1 according to the first embodiment of the present invention, formed on a semiconductor substrate, will be described with reference to the drawings. FIG. 5 is a diagram showing the layout of the semiconductor device 1 formed on a semiconductor substrate 100.

As shown in FIG. 5, the semiconductor device 1 has a well region (hereinafter to be referred to as an n-well region) 101n formed by having n type impurities doped in predetermined regions (hereinafter to be referred as element forming regions or active regions) of the semiconductor substrate 100 (e.g., a p type silicon substrate) where p type transistors are formed. In the following description, a region where the pMOS transistor $QP_0$ shown in FIG. 4 is formed will be referred to as a first region (also called a first element forming region) AP1, and a region where the pMOS transistors $QP_1$-$QP_n$ are formed will be referred to as a second region (also called a second element forming region) AP2. Moreover, a region where the nMOS transistor $QN_0$ is formed will be referred to as a third region (also called a third element forming region) AN1, and a region where the nMOS transistors $QN_1$-$QN_n$ are formed will be referred to as a fourth region (also called a fourth element forming region) AN2.

As shown in FIG. 5, for instance, the horizontal widths (i.e., the widths in a horizontal direction or the widths in the long direction in the drawing) of the first region AP1 and the third region AN1 are almost the same. Likewise, for instance, the horizontal widths of the second region AP2 and the fourth region AN2 are almost the same. By applying such a layout, it is possible to make the number of the pMOS transistors $QP_0$-$QP_n$ and the number of the nMOS transistors $QN_0$-$QN_n$ the same.

Moreover, the vertical width (i.e., the width in a vertical direction or the width in the short direction in the drawing) of the first region AP1 is about double, or preferably more than double, the vertical width of the third region AN1. Likewise, the vertical width of the second region AP2 is about double, or preferably more than double, the vertical width of the fourth region AN2. By applying such arrangement, it is possible to make the operation speed of the pMOS transistors and the operation speed of the nMOS transistors the same, or it is possible to make the operation speed of the pMOS transistors faster than the operation speed of the nMOS transistors.

In addition, the horizontal widths of the second region AP2 and the fourth region AN2 are longer than the horizontal width of the first region AP1 or the third region AN1. By this arrangement, it is possible to make much more surge current flow to the dummy transistors (i.e. dummy nMOS transistors $QN_3$-$QN_n$ etc.).

On the first region AP1 and the second region AP2, source regions 103p and drain regions 104p are formed, respectively, by having p type impurities being doped therein, respectively. In the meantime, on the third region AN1 and the fourth region AN2, source regions 103n and drain regions 104n are formed, respectively, by having n type impurities being doped therein, respectively. In addition, on regions sandwiched between the source regions 103p and the drain regions 104p and between the source regions 103n and the drain regions 104n, respectively, gate electrodes 102 are formed, respectively. Each of these gate electrodes 102 is formed so as to bridge over two adjacent regions (i.e., element forming regions) based on particular needs. Here, although it is not shown, gate insulation films are supposed to be formed between the gate electrodes 102 and the semiconductor substrate 100, respectively. Furthermore, in a predetermined region of the semiconductor substrate 100, the resistance R2 is formed.

In the layout described so far, the n-well region 101n formed in the first region AP1 and the second region AP2, the source regions 103p and the drain regions 104p formed in the first region AP1 and the second region AP2, respectively, and the gate electrodes 102 (including the gate insulation films) formed in the first region AP1 and the second region AP2, form the pMOS transistors $QP_0$-$QP_n$ shown in FIG. 4. In addition, the source regions 103n and the drain regions 104n formed in the third region AN1 and the fourth region AN2, respectively, and the gate electrodes 102 (including the gate insulation films) formed in the third region AN1 and the fourth region AN2, form the nMOS transistors $QN_0$-$QN_n$ (including the dummy nMOS transistors) shown in FIG. 4. In this structure, the pMOS transistors $QP_1$-$QP_n$ formed in the second region AP2 and the nMOS transistors $QN_1$-$QN_n$ formed in the fourth region AN2 protect the pMOS transistor $QP_0$ formed in the first region AP1 and the nMOS transistor $QN_0$ formed in the third region AN1.

In the example shown in FIG. 5, although the resistance (diffusion resistance) R2 is formed by doping predetermined impurities into a predetermined region in the semiconductor substrate 100, the present invention is not limited to such condition, and it is also possible to apply a resistive element formed on an upper layer of the semiconductor substrate 100 as a discrete component (e.g. a non-doped polysilicon film), for instance.

By applying the layout structure as described above, it is possible to form the inverter circuit 10, the buffer circuit 20, the dummy circuit 21, and the gate potential control circuit 30 on a single semiconductor substrate 100. However, this layout structure is only an example of the present invention which can be easily modified.

Circuit Operation

Now an operation of the semiconductor device 1 having the circuit structure as described above will be described.

First of all, in a normal operation, since an internal power supply voltage VDD, i.e. High level, is being applied to the gate potential control circuit 30 via the resistance R2, the pMOS transistor $QP_0$ is turned OFF while the nMOS transistor $QN_0$ is turned ON at the same time. Accordingly, Low level will appear at the node n6 disposed at an output stage of the gate potential control circuit 30. Therefore, Low level will be impressed to the gates of the dummy nMOS transistors $QN_3$-$QN_n$ that form the dummy circuit 21, by which the dummy nMOS transistors $QN_3$-$QN_n$ will constantly be turned OFF. This means that in the normal operation, the gate potential control circuit will not function.

When a surge current such as a static charge is inputted to the node n1, for instance, the voltage level of the power wiring $L_{VDD}$ will become indefinite. Therefore, a voltage which is determined by capacitance voltage division will be impressed to the gates of the pMOS transistor $QP_0$ and the nMOS transistor $QN_0$ forming the gate potential control circuit 30. This voltage determined by capacitance voltage division is a midpoint potential between the internal power supply voltage VDD and the ground potential GND. Accordingly, the output potential of the gate potential control circuit 30, i.e., the drains of the pMOS transistor $QP_0$ and the nMOS transistor $QN_0$, to which this midpoint potential is inputted will become indefinite. Therefore, the gate potential control circuit 30 will output the midpoint potential. This midpoint potential will be impressed to the gate of each of the dummy nMOS transistors $QN_3$-$QN_n$ forming the dummy circuit 21, via the node n6. Thereby, the dummy nMOS transistors $QN_3$-$QN_n$ will be turned ON either completely or incompletely. In other words, the dummy nMOS transistors $QN_3$-$QN_n$ will loosely be in the ON state. Accordingly, the surge current flowed into the drain side through the pMOS transistors $QP_2$-$QP_n$ in the buffer circuit 20 can be made to flow out to the grounding wiring $L_{GND}$ side through the dummy circuit 21. This means that a current path for allowing the surge current to escape to the grounding wiring $L_{GND}$ side is formed not only in the nMOS transistor $QN_2$ in the buffer circuit 20 but also in the dummy nMOS transistors $QN_3$-$QN_n$ in the dummy circuit 21.

Now, the effects which can be obtained by the semiconductor device 1 according to the first embodiment of the present invention by having improved withstand voltage characteristics will be explained by comparing the semiconductor device 1 with the semiconductor device 600 shown in FIG. 3 as the comparative example 3. In the following explanation, the current path passing through the nMOS transistor $QN_2$ forming the buffer circuit 20 in the semiconductor device 1 according to first embodiment of the present invention will be referred to as a path A, and likewise, the current path passing through each of the dummy nMOS transistors $QN_3$-$QN_n$ forming the dummy circuit 21 in the semiconductor device 1 will be referred to as a path B. On the other hand, the current path passing through the buffer circuit 720 in the semiconductor device 600 according to the comparative example 3 will be referred to as a path a, and likewise, the current path passing through each of the dummy nMOS transistors $qn_3$-$qn_n$ forming the dummy circuit 621 in the semiconductor device 600 will be referred to as a path b.

Figure 6:
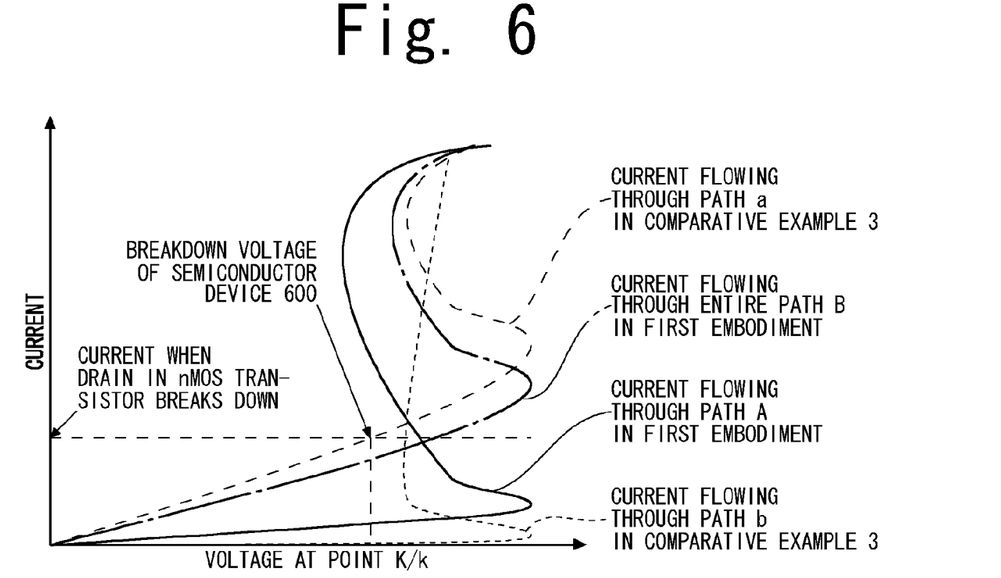
FIG. 6 is a graphic view showing currents flowing into paths A and B in the semiconductor device according to the first embodiment of the present invention, and currents flowing into paths a and b in a semiconductor device according to the comparative example 3.

In FIG. 6, currents flowing into the whole of the paths A and B in the semiconductor device 1, respectively, and currents flowing into the whole of the paths a and b in the semiconductor device 600, respectively, at the time when a surge current is inputted to the power wiring $L_{VDD}$ will be shown.

As can be seen in FIG. 6, when comparing the semiconductor device 1 and the semiconductor device 600, the current flowing the path B is larger than the current flowing the path b, and thereby, the current flowing the path A is smaller than the current flowing into the path a. In other words, the current flowing into the nMOS transistor $QN_2$ in the buffer circuit 20 at the time when the surge current is inputted will decrease considerably. This is because in the semiconductor device 600, the gate potentials of the dummy nMOS transistors $qn_3$-$qn_n$ are fixed to a GND level, due to which the dummy nMOS transistors $qn_3$-$qn_n$ become difficult to be turned ON, i.e., the dummy nMOS transistors $qn_3$-$qn_n$ become difficult to be placed in a state in which current is passed, whereas in the semiconductor device 1, the dummy nMOS transistors $QN_3$-$QN_n$ are controlled to be turned ON or OFF based on a potential level of the power wiring $L_{VDD}$, due to which the dummy nMOS transistors $QN_3$-$QN_n$ can be turned ON without fail when the power wiring $L_{VDD}$ is in an indefinite state. Accordingly, it is clear that the withstand voltage characteristic is improved in the semiconductor device 1 according to the first embodiment of the present invention.

Moreover, because the semiconductor device 1 according to the first embodiment of the present invention can apply the nMOS transistors which have been used in the conventional buffer circuit as the dummy nMOS transistors $QN_3$-$QN_n$, the semiconductor device 1 can be manufactured with little change of layout, and with the use of the same manufacturing processes as those in conventional cases.

Furthermore, since the gate potential control circuit 30 used in the first embodiment of the present invention is an inverter circuit (this is also a CMOS transistor circuit) including one pMOS transistor $QP_0$ and one nMOS transistor $QN_0$ as a minimum unit, it is possible to keep the increase in the circuit area of the semiconductor device 1 small. This means that it is possible to practically prevent the size of the circuit from increasing.

In this way, the semiconductor device 1 according to the first embodiment of the present invention comprises a pMOS transistor $QP_2$ in which the source thereof is connected to a power source line $L_{VDD}$, an nMOS transistor $QN_2$ in which the source thereof is connected to a grounding wiring $L_{GND}$ and the drain thereof is connected to a drain of the pMOS transistor $QP_2$, dummy nMOS transistors $QN_3$-$QN_n$ in which each source thereof is connected to the grounding wiring $L_{GND}$ and each drain thereof is connected to the drains of the pMOS transistor $QP_2$ and the nMOS transistor $QN_2$, and a gate potential control circuit 30 which controls the gate potentials of the dummy nMOS transistors $QN_3$-$QN_n$ based on the potential of the power wiring $L_{VDD}$.

By having the above structure, it is possible to make the dummy nMOS transistors $QN_3$-$QN_n$ turn ON when a surge current, for instance, is inputted to the power wiring $L_{VDD}$. As a result, a surge current having passed through the pMOS transistors QP$_2$-QP$_n$ in the buffer circuit 20 can be discharged effectively to the grounding wiring L$_{GND}$ via the dummy nMOS transistors QN$_3$-QN$_n$. Accordingly, it is possible to prevent a considerable amount of current from flowing into the nMOS transistor QN$_2$ in the buffer circuit 20, and as a result, it is possible to prevent the nMOS transistor QN$_2$, particularly the drain side of the nMOS transistor QN$_2$, from being damaged. This means that the buffer circuit 20 can have improved withstand voltage characteristics when it is a CMOS transistor circuit.

In addition, according to the first embodiment of the present invention, even when a comparatively small CMOS transistor circuit such as the inverter circuit 10 is connected in parallel with a comparatively large CMOS transistor circuit such as the buffer circuit 20, for instance, since a surge current is supposed to be distributed according to circuit size, it is also possible to prevent the inverter circuit 10 from being damaged by the surge current in addition to the buffer circuit 20.

Second Embodiment

Next, a second embodiment of the present invention will be described in detail with reference to the drawings. In the following, the same reference numbers will be used for the structural elements that are the same as the first embodiment, and redundant explanations of those structural elements will be omitted.

Circuit Structure

Figure 7:
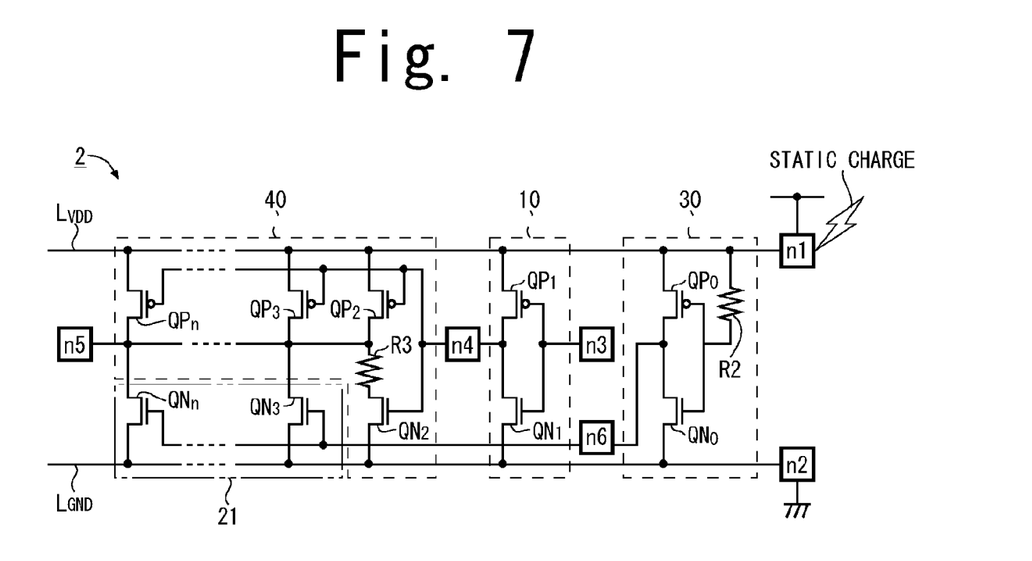
FIG. 7 is a circuit diagram showing a semiconductor device according to a second embodiment of the present invention.

FIG. 7 is a diagram showing a circuit structure of a semiconductor device 2 according to the second embodiment of the present invention. As shown in FIG. 7, the semiconductor device 2 has the same structure as the semiconductor device 1 in the first embodiment, except that the buffer circuit 20 used in the semiconductor device 1 is replaced with a buffer circuit 40.

The buffer circuit 40 has the basic structure of the buffer circuit 20 in the first embodiment, to which a resistance (a first resistance) R3 is additionally provided at the drain of the nMOS transistor QN$_2$. That is, the buffer circuit 40 has a structure in which the resistance R3 and the nMOS transistor QN$_2$ connected in series are arranged in place of the nMOS transistor QN$_2$ in the first embodiment.

In this way, by having the resistance R3 at the drain of the NMOS transistor QN$_2$, it is possible to make it even more difficult for a current to flow to the NMOS transistor QN$_2$, as compared to the case of applying a structure without the resistance R3, where the dummy NMOS transistors QN$_3$-QN$_n$ in the dummy circuit 21 alone are expected to bring about the same effect. Accordingly, when a surge current is inputted to the power wiring L$_{VDD}$, for instance, it is possible to let even more surge current flow into the dummy NMOS transistors QN$_3$-QN$_n$ in the dummy circuit 21. That is, in the semiconductor device 2 according to the second embodiment of the present invention, the NMOS transistor QN$_2$, particularly the drain side of the NMOS transistor QN$_2$, can have improved withstand voltage characteristics.

As for the rest of the circuit structure of the semiconductor device 2, a detailed description will be omitted here since it is the same as the semiconductor device 1 in the first embodiment.

Layout

Figure 8:
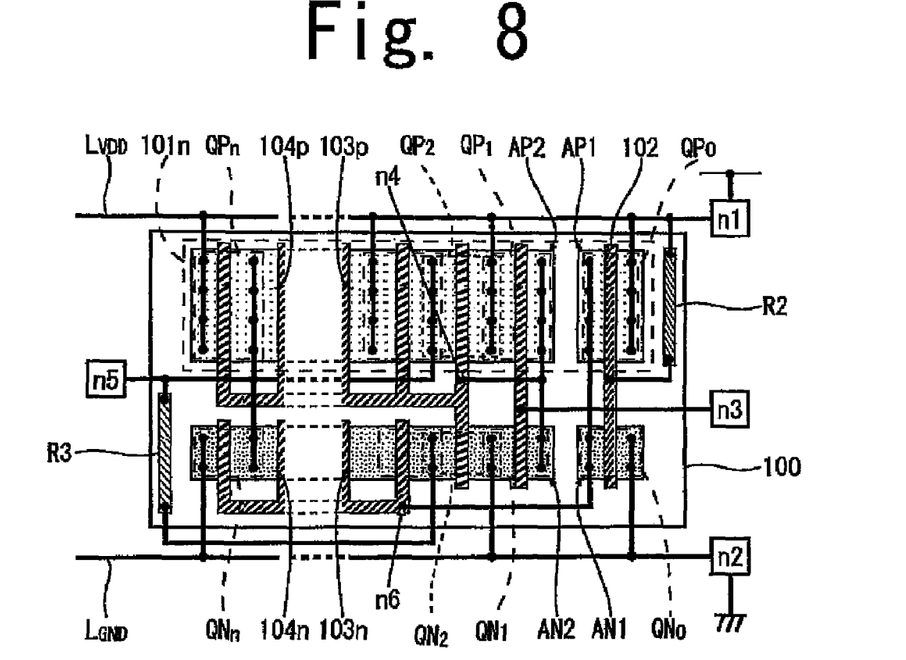
FIG. 8 is a diagram showing the layout of the semiconductor device according to the second embodiment of the present invention.

FIG. 8 shows the layout of the semiconductor substrate 100 in the semiconductor device 2 according to the second embodiment of the present invention. As shown in FIG. 8, the semiconductor device 2 has the basic layout of the semiconductor device 1 in the first embodiment, in which the resistance R3 is additionally arranged in a predetermined region of the semiconductor substrate 100. One end of the resistance R3 is connected to a line pattern, to which the node n5 is connected, via a predetermined metal wiring. On the other hand, the other end of the resistance R3 is connected to the drain of the NMOS transistor QN$_2$ via a predetermined metal wiring.

By applying such layout structure, it is possible to form the inverter circuit 10, the buffer circuit 40, the dummy circuit 21, and the gate potential control circuit 30 on the single semiconductor substrate 100. As for the rest of the layout structure of the semiconductor device 2, a detailed description will be omitted here since it is the same as the semiconductor device 1 in the first embodiment. It should be noted that the layout structure just described is merely an example, which can be easily modified.

Circuit Operation

A description of the operation of the semiconductor device 2 according to the second embodiment of the present invention will be omitted here since it is the same as the semiconductor device 1 in the first embodiment.

The effects which can be obtained by the semiconductor device 2 according to the second embodiment of the present invention by having improved withstand voltage characteristics will be explained by comparing the semiconductor device 2 with the semiconductor device 1 described in the first embodiment of the present invention. In the following explanation, the current path passing through the nMOS transistor QN$_2$ constructing the buffer circuit 40 in the semiconductor device 2 according to second embodiment of the present invention will be referred to as a path A', and likewise, the current path passing through each of the dummy nMOS transistors QN$_3$-QN$_n$ forming the dummy circuit 21 in the semiconductor device 2 will be referred to as a path B'. On the other hand, as mentioned earlier with respect to the first embodiment, the current paths passing through the nMOS transistor QN$_2$ and through each of the dummy nMOS transistors QN$_3$-QN$_n$ in the semiconductor device 1 will still be path A and path B, respectively.

Figure 9:
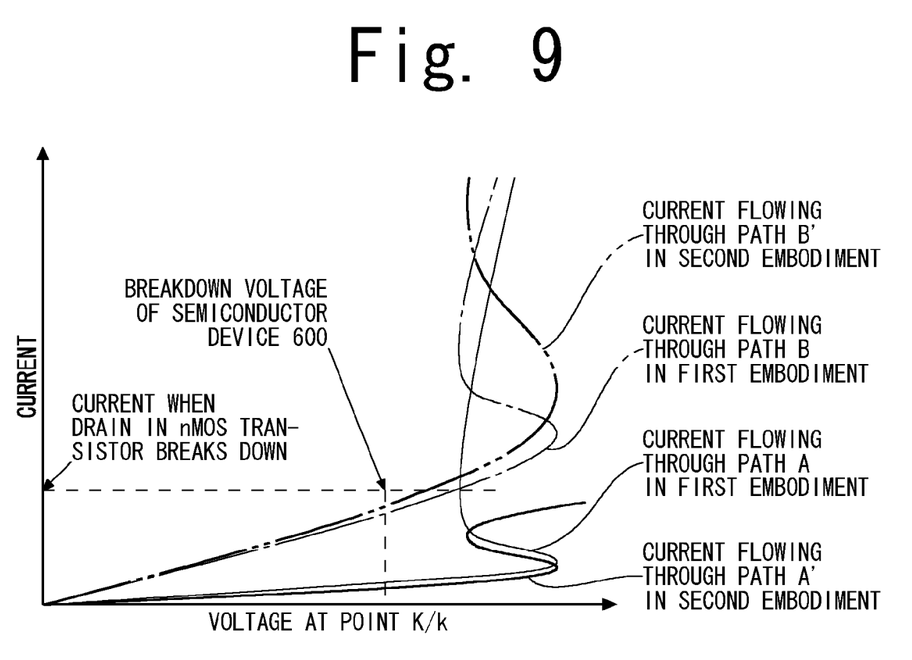
FIG. 9 is a graphic view showing currents flowing into paths A' and B' in the semiconductor device according to the second embodiment of the present invention, and currents flowing into the paths A and B in the semiconductor device according to the first embodiment of the present invention.

In FIG. 9, currents flowing into the whole of the paths A' and B' in the semiconductor device 2, respectively, and currents flowing into the whole of the paths A and B in the semiconductor device 1, respectively, at the time when a surge current is inputted to the power wiring L$_{VDD}$ will be shown.

As can be seen in FIG. 9, when comparing the semiconductor device 2 and the semiconductor device 1, the current flowing in the path B' is larger than the current flowing in the path B, and thereby, the current flowing in the path A' is smaller than the current flowing the path A. In other words, the current flowing into the nMOS transistor QN$_2$ in the buffer circuit 40 at the time when the surge current is inputted is decreased. This is because in the semiconductor device 2, the resistance R3 is disposed at the drain of the nMOS transistor QN$_2$, and this resistance R3 makes it difficult for a current to flow into the nMOS transistor QN$_2$. Accordingly, it is clear that the withstand voltage characteristics are improved in the semiconductor device 2 according to the second embodiment of the present invention.

Moreover, as in the first embodiment, because the semiconductor device 2 according to the second embodiment of the present invention can apply the nMOS transistors which have been used in the conventional buffer circuit as the dummy nMOS transistors QN$_3$-QN$_n$, the semiconductor device 2 can be manufactured with little change of layout and with the use of the same manufacturing processes as those in the conventional cases.

Furthermore, as in the first embodiment, since the gate potential control circuit 30 used in the second embodiment of the present invention is an inverter circuit (this is also a CMOS transistor circuit) including one pMOS transistor $QP_0$ and one nMOS transistor $QN_0$ as a minimum unit, it is possible to keep the increase in the circuit area of the semiconductor device 2 small. This means that it is possible to practically prevent the size of the circuit from becoming larger.

In this way, the semiconductor device 2 according to the second embodiment of the present invention comprises a pMOS transistor $QP_2$ in which the source thereof is connected to a power source line $L_{VDD}$, an nMOS transistor $QN_2$ in which the source thereof is connected to the grounding wiring $L_{GND}$ and the drain thereof is connected to the drain of the pMOS transistor $QP_2$, dummy nMOS transistors $QN_3$-$QN_n$ in which each source thereof is connected to the grounding wiring $L_{GND}$ and each drain thereof is connected to the drains of the pMOS transistor $QP_2$ and the nMOS transistor $QN_2$, and a gate potential control circuit 30 which controls the gate potential of the dummy nMOS transistors $QN_3$-$QN_n$ based on the potential of the power wiring $L_{VDD}$.

By having the above structure, it is possible to make the dummy nMOS transistors $QN_3$-$QN_n$ turn ON when a surge current, for instance, is inputted to the power wiring $L_{VDD}$. As a result, a surge current having passed through the pMOS transistors $QP_2$-$QP_n$ in the buffer circuit 40 can be discharged effectively to the grounding wiring $L_{GND}$ via the dummy nMOS transistors $QN_3$-$QN_n$. Accordingly, it is possible to prevent a considerable amount of current from flowing into the nMOS transistor $QN_2$ in the buffer circuit 40, and as a result, it is possible to prevent the nMOS transistor $QN_2$, particularly the drain side of the nMOS transistor $QN_2$, from being damaged. This means that the buffer circuit 40 can have improved withstand voltage characteristics when it is a CMOS transistor circuit.

Furthermore, according to the second embodiment of the present invention, even when a comparatively small CMOS transistor circuit such as the inverter circuit 10 is connected in parallel with a comparatively large CMOS transistor circuit such as the buffer circuit 40, for instance, since a surge current is supposed to be distributed according to a circuit size, it is also possible to prevent the inverter circuit 10 from being damaged by the surge current in addition to the buffer circuit 40.

In addition, in the semiconductor device 2 according to the second embodiment of the present invention, the buffer circuit 40, particularly the nMOS transistor $QN_2$ in the buffer circuit 40 which can be damaged rather easily, has the resistance R3 at the drain thereof because it is an object of protection. Therefore, in the semiconductor device of the second embodiment, it is possible to make it even more difficult for a surge current to flow into the nMOS transistor $QN_2$ as compared to the first embodiment. In other words, according to the second embodiment of the present invention, it is possible to make more surge current flow into the dummy circuit 21, and as a result, the buffer circuit 40 being a CMOS transistor circuit can provide even more improved voltage withstand characteristics.

While the preferred embodiments of the invention have been described using specific terms, such description is for illustrative purposes only, and it is to be understood that changes and variations may be made without departing from the spirit or the scope of the following claims.

In the above-described embodiments, for instance, a situation in which the nMOS transistor in the buffer circuit 20 or 40 has a smaller gate width than the pMOS transistor was described. However, the present invention is not limited to this situation, and it is possible to let the pMOS transistor have a smaller gate width than the nMOS transistor. The circuit structure of a semiconductor device 1' in such case will be shown in FIG. 10 as a modified example of the semiconductor device 1 according to the first embodiment of the present invention.

Figure 10:
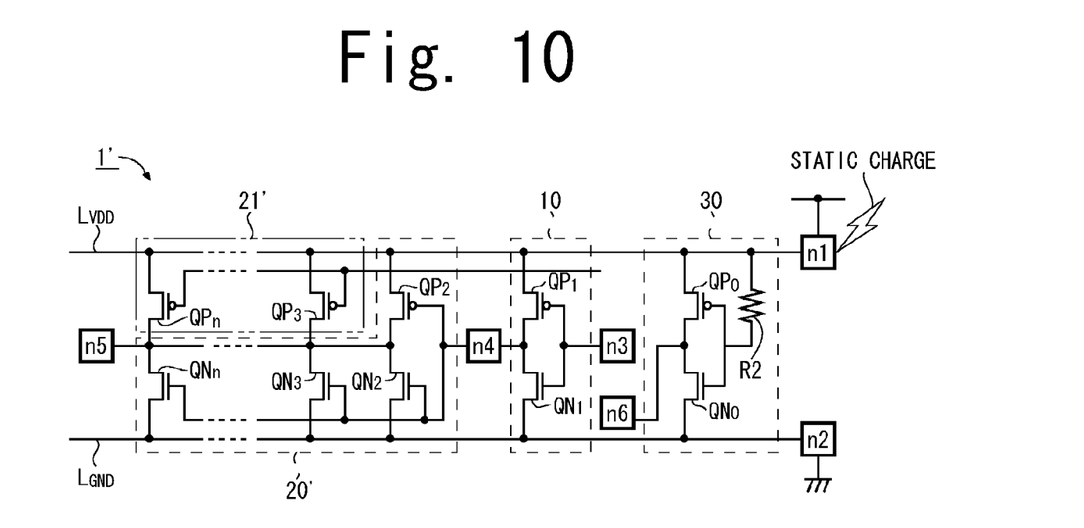
FIG. 10 is a modified circuit diagram showing a semiconductor device according to the first embodiment of the present invention.

As shown in FIG. 10, the semiconductor device 1' has a modified structure of the semiconductor device 1, in which the buffer circuit 20 is replaced with the buffer circuit 20' and the dummy circuit 21 is replaced with the dummy circuit 21'. The buffer circuit 20' has a pMOS transistor $QP_2$ and nMOS transistors $QN_2$-$QN_n$. Moreover, the dummy circuit 21' has pMOS transistors $QP_3$-$QP_n$, the number of which corresponding to the number of pMOS transistors having been eliminated in the buffer circuit 20'. With this structure, it is possible to prevent the pMOS transistor $QP_2$, particularly the drain of the pMOS transistor $QP_2$, from being damaged by a surge current inputted to the power wiring $L_{VDD}$. Considering the overall description given above, it is understandable that the second embodiment 2 can also have a structure modified in the same way.

Furthermore, although a situation was described above in the second embodiment of the present invention in which each CMOS transistor is constructed with a number of pMOS transistors and nMOS transistors connected in series between the power wiring and the grounding wiring, the present invention is not limited thereto. For instance, the present invention may have a structure in which two nMOS transistors are connected in series between the power wiring and the grounding wiring, or it may have a structure in which two pMOS transistors are connected in series between the power wiring and grounding wiring. In such case however, an inverter circuit is arranged at the gate input stage of the nMOS transistor which is provided in place of the pMOS transistor, or at the gate input stage of the pMOS transistor which is provided in place of the nMOS transistor.

This application claims priority to Japanese Patent Application No. 2005-135652. The entire disclosures of Japanese Patent Application No. 2005-135652 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. A semiconductor device comprising:
   a first transistor having a source connected to a first wiring;
   a second transistor having a source connected to a second wiring and having a drain connected to a drain of the first transistor;
   a third transistor having a source connected to a second wiring and having a drain connected to the drains of the first and second transistors; and
   a gate potential control circuit which controls a gate potential of the third transistor based on a potential of the first wiring,
   wherein an output of the gate potential control circuit is input to a gate of the third transistor, and wherein the third transistor is constantly turned off during normal operation of the semiconductor device, and is either turned on completely or partly when a surge current is input at the first wiring.

2. The semiconductor device according to claim 1, further comprising:
   a first resistance connected between the drains of the first and second transistors, wherein the drain of the third transistor is connected to the drain of the second transistor through the first resistance.

3. The semiconductor device according to claim 1, wherein the gate potential control circuit comprises:
   a fourth transistor having a source connected to the first wiring; and
   a fifth transistor having a source connected to the second wiring, a drain connected to a drain of the fourth transistor and to the gate of the third transistor, and a gate connected to the first wiring.

4. The semiconductor device according to claim 3, wherein the gate potential control circuit further comprises a resistance having a first end connected to the first wiring, and a second end connected to the gate of the fifth transistor and to a gate of the fourth transistor.

5. The semiconductor device according to claim 1, further comprising a plurality of the first transistor and a plurality of the third transistor, wherein a number of the first transistors is equal to a sum of a number of the second transistor and a number of the third transistors.

6. The semiconductor device according to claim 1, wherein the first transistor is a p-type transistor, and the second and third transistors are n-type transistors.

7. The semiconductor device according to claim 1, wherein the first wiring is a power wiring and the second wiring is a ground wiring.

8. A semiconductor device comprising:
   a first transistor having a source connected to a first wiring;
   a second transistor having a source connected to a second wiring and having a drain connected to a drain of the first transistor;
   a third transistor having a source connected to a second wiring and having a drain connected to the drains of the first and second transistors; and
   a gate potential control circuit which includes
      a fourth transistor having a source connected to the first wiring, and
      a fifth transistor having a source connected to the second wiring, a drain connected to a drain of the fourth transistor and to a gate of the third transistor, and a gate connected to the first wiring and to a gate of the fourth transistor,
   wherein an output of the gate potential control circuit is connected to the third transistor.

9. The semiconductor device according to claim 8, further comprising:
   a first resistance connected between the drains of the first and second transistors, wherein the drain of the third transistor is connected to the drain of the second transistor through the first resistance.

10. The semiconductor device according to claim 8, wherein the gate potential control circuit further comprises a resistance having a first end connected to the first wiring, and a second end connected to the gates of the fourth and fifth transistors.

11. The semiconductor device according to claim 8, further comprising a plurality of the first transistor and a plurality of the third transistor, wherein a number of the first transistors is equal to a sum of a number of the second transistor and a number of the third transistors.

12. The semiconductor device according to claim 8, wherein the second and third transistors are n-type transistors, and the first transistor is a p-type transistor.

13. The semiconductor device according to claim 8, wherein the first wiring is a power wiring and the second wiring is a ground wiring.

* * * * *